US011950005B2

(12) United States Patent
Amikawa et al.

(10) Patent No.: US 11,950,005 B2
(45) Date of Patent: Apr. 2, 2024

(54) SOLID-STATE IMAGING DEVICE AND IMAGING APPARATUS

(71) Applicant: Nuvoton Technology Corporation Japan, Kyoto (JP)

(72) Inventors: Hiroyuki Amikawa, Ishikawa (JP); Makoto Ikuma, Hyogo (JP); Kazutoshi Onozawa, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 99 days.

(21) Appl. No.: 17/868,349

(22) Filed: Jul. 19, 2022

(65) Prior Publication Data

US 2022/0353445 A1    Nov. 3, 2022

Related U.S. Application Data

(63) Continuation-in-part of application No. PCT/JP2021/005737, filed on Feb. 16, 2021.

(30) Foreign Application Priority Data

Feb. 20, 2020    (JP) ................................ 2020-027393

(51) Int. Cl.
H04N 25/59        (2023.01)
H04N 25/616       (2023.01)
(Continued)

(52) U.S. Cl.
CPC ........... *H04N 25/616* (2023.01); *H04N 25/59* (2023.01); *H04N 25/75* (2023.01); *H04N 25/65* (2023.01);
(Continued)

(58) Field of Classification Search
CPC ...... H04N 25/616; H04N 25/59; H04N 25/75; H04N 25/65; H04N 25/677; H04N 25/771;
(Continued)

(56) References Cited

U.S. PATENT DOCUMENTS 8,098,312 B2 *   1/2012   Matsuo ............... H01L 27/1464
                                                348/297
2016/0104733 A1 *   4/2016   Sato .......................... H04N 5/32
                                                250/208.1
(Continued)

FOREIGN PATENT DOCUMENTS

JP    2003-101006 A    4/2003
JP    2006-217410 A    8/2006
(Continued)

OTHER PUBLICATIONS

International Search Report dated May 25, 2021 in International Patent Application No. PCT/JP2021/005737, with English translation.

*Primary Examiner* — Hung H Lam
(74) *Attorney, Agent, or Firm* — Rimon P.C.

(57) ABSTRACT

A solid-state imaging device includes: a photoelectric conversion element that is disposed on a semiconductor substrate and generates signal charges by photoelectric conversion; a first diffusion layer that holds signal charges transferred from the photoelectric conversion element; a capacitive element that holds signal charges overflowing from the photoelectric conversion element; an amplifier transistor that outputs a signal according to the signal charges in the first diffusion layer; a first contact that is connected to the first diffusion layer; a second contact that is connected to a gate of the amplifier transistor; and a first wire that connects the first contact and the second contact. A shortest distance between the semiconductor substrate and the first wire is less than a shortest distance between the semiconductor substrate and the capacitive element.

20 Claims, 10 Drawing Sheets

(51) Int. Cl.
*H04N 25/75* (2023.01)
*H04N 25/65* (2023.01)
*H04N 25/677* (2023.01)
*H04N 25/771* (2023.01)

(52) U.S. Cl.
CPC ......... *H04N 25/677* (2023.01); *H04N 25/771* (2023.01)

(58) Field of Classification Search
CPC ......... H01L 27/14609; H01L 27/14643; H01L 27/14654
See application file for complete search history.

(56) References Cited

U.S. PATENT DOCUMENTS

| | | | |
|---|---|---|---|
| 2016/0133660 A1* | 5/2016 | Inoue | H04N 25/772 257/43 |
| 2019/0289240 A1* | 9/2019 | Zhu | H04N 25/77 |
| 2020/0066773 A1* | 2/2020 | Tashiro | H04N 25/59 |
| 2021/0013253 A1 | 1/2021 | Takase et al. | |
| 2021/0091170 A1* | 3/2021 | Yamada | H01L 21/02126 |

FOREIGN PATENT DOCUMENTS

| | | |
|---|---|---|
| JP | 2009-165186 A | 7/2009 |
| JP | 2010-118412 A | 5/2010 |
| JP | 2016-028438 A | 2/2016 |
| WO | 2019/193787 A1 | 10/2019 |

\* cited by examiner

SOLID-STATE IMAGING DEVICE AND IMAGING APPARATUS

CROSS REFERENCE TO RELATED APPLICATIONS

The present application is a continuation-in-part of PCT International Application No. PCT/JP2021/005737 filed on Feb. 16, 2021, and claims the benefit of Japanese Patent Application No. 2020-027393 filed on Feb. 20, 2020. The entire disclosures of the above-identified applications, including the specifications, drawings and claims are incorporated herein by reference in their entirety.

FIELD

The present disclosure relates to a solid-state imaging device and an imaging apparatus.

BACKGROUND

Conventionally, in order to increase a dynamic range, a solid-state imaging device described in, for example, Patent Literature (PTL) 1 has been proposed. The solid-state imaging device of PTL 1 includes: an overflow gate that transfers charges overflowing from a photodiode; and a capacitive element that accumulates the charges transferred by the overflow gate at the time of an accumulation operation. The solid-state imaging device combines a low illuminance signal and a high illuminance signal to increase a dynamic range.

CITATION LIST

Patent Literature

PTL 1: Japanese Unexamined Patent Application Publication No. 2006-217410

SUMMARY

Technical Problem

According to PTL 1, however, there is a problem in that an SN ratio deteriorates along with an increase in dynamic range.

In view of this, the present disclosure provides a solid-state imaging device, an imaging apparatus, and an imaging method that reduce deterioration of an SN ratio along with an increase in dynamic range.

Solution to Problem

In order to solve the above problem, a solid-state imaging device according to one aspect of the present disclosure includes: a photoelectric conversion element that is disposed on a semiconductor substrate and generates signal charges by photoelectric conversion; a first diffusion layer that holds signal charges transferred from the photoelectric conversion element; a capacitive element that holds signal charges overflowing from the photoelectric conversion element; an amplifier transistor that outputs a signal according to the signal charges in the first diffusion layer; a first contact that is connected to the first diffusion layer; a second contact that is connected to a gate of the amplifier transistor; and a first wire that connects the first contact and the second contact. A shortest distance between the semiconductor substrate and the first wire is less than a shortest distance between the semiconductor substrate and the capacitive element.

Moreover, an imaging apparatus according to one aspect of the present disclosure includes: the solid-state imaging device that captures a subject; an imaging optical system that guides incident light from the subject to the solid-state imaging device; and a signal processor that processes an output signal from the solid-state imaging device.

Advantageous Effects

A solid-state imaging device and an imaging apparatus according to the present disclosure make it possible to reduce deterioration of an SN ratio along with an increase in dynamic range.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Each of exemplary embodiments described blow shows a specific example. The numerical values, shapes, materials, constituent elements, the arrangement and connection of the constituent elements, steps, the processing order of the steps, etc. shown in the following exemplary embodiments are mere examples, and are not intended to limit the scope of the present disclosure.

Moreover, of the constituent elements described in the following embodiments, constituent elements not recited in any one of the independent claims that indicate the broadest concepts are described as optional constituent elements.

Embodiment 1

Hereinafter, a solid-state imaging device according to Embodiment 1 will be described with reference to the drawings.

1. Configuration Example of Solid-State Imaging Device 100

Figure 1:
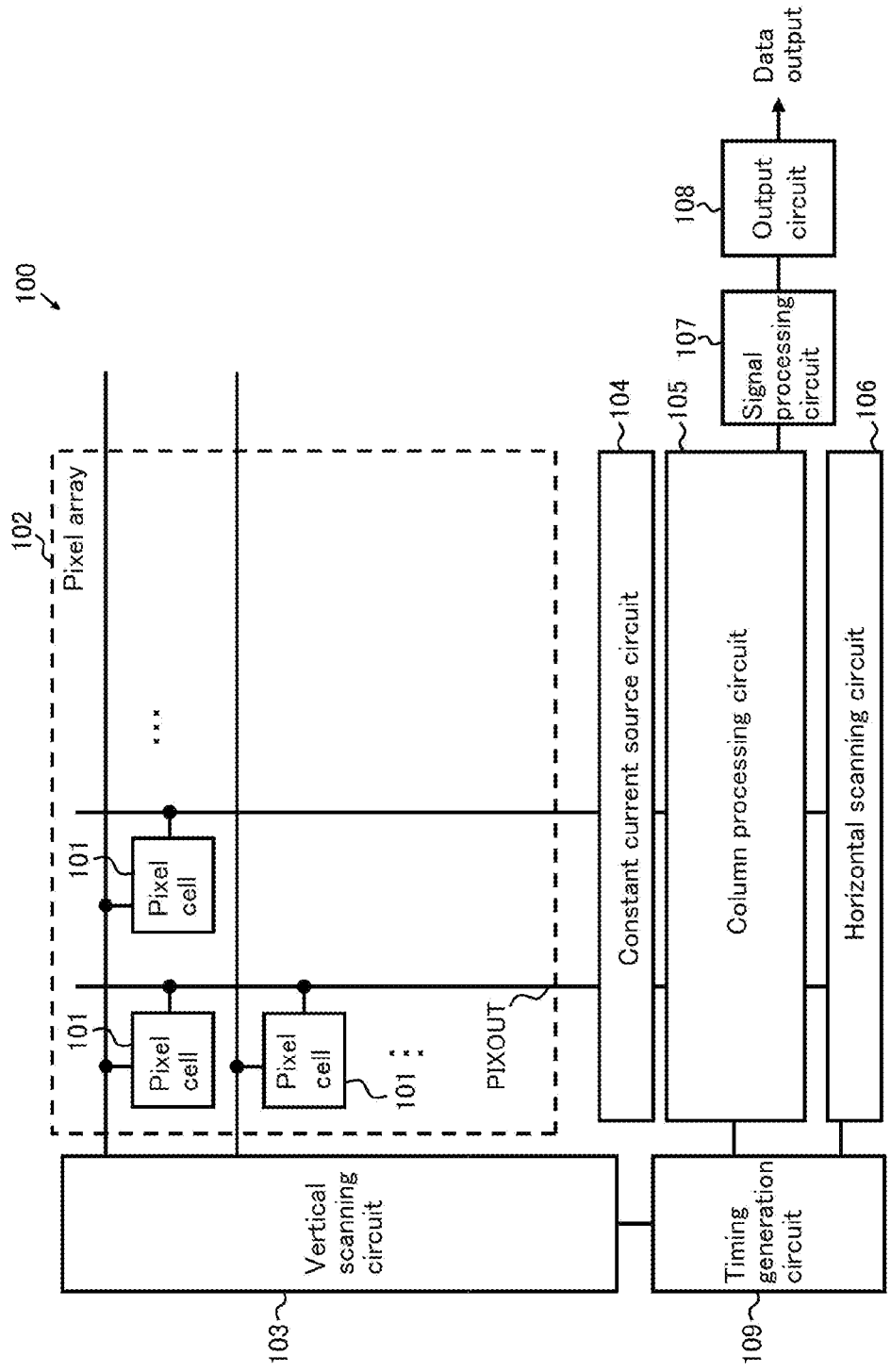
FIG. 1 is a block diagram illustrating an outline of a configuration example of a solid-state imaging device according to Embodiment 1.

FIG. 1 is a configuration diagram illustrating solid-state imaging device 100 according to Embodiment 1.

As shown in FIG. 1, solid-state imaging device 100 according to the present embodiment includes pixel array 102, vertical scanning circuit 103, constant current source circuit 104, column processing circuit 105, horizontal scanning circuit 106, signal processing circuit 107, output circuit 108, timing generation circuit 109, and vertical signal line PIXOUT.

Pixel array 102 includes a lot of pixel cells (unit cells) 101 that are arranged in a matrix and each of which performs photoelectric conversion.

Vertical signal line PIXOUT is connected to constant current source circuit 104 and column processing circuit 105, and transmits signals of pixel cells 101 for each column of pixel cells 101.

Vertical scanning circuit 103 drives pixel array 102.

Constant current source circuit 104 includes a constant current source corresponding to each column of pixel cells 101.

Column processing circuit 105 includes a correlated double sampling (CDS) circuit that receives pixel signals of each column and serves as a noise canceller, and an analog-to-digital converter (ADC) that receives pixel signals from the CDS circuit.

Horizontal scanning circuit 106 selects, for each column, data resulting from analog-to-digital conversion, and causes signal processing circuit 107 to sequentially output the data.

Signal processing circuit 107 performs signal processing on data outputted from column processing circuit 105.

Output circuit 108 is a buffer circuit that outputs, to the outside of solid-state imaging device 100, data on which signal processing circuit 107 has performed signal processing.

Timing generation circuit 109 generates a timing signal for causing each part of solid-state imaging device 100 to operate.

Moreover, the CDS circuit included in column processing circuit 105 is connected to, for example, each of the columns of pixel cells 101 arranged in the matrix in pixel array 102. Furthermore, the CDS circuit performs CDS processing on signals outputted from pixel cells 101 of a row selected by vertical scanning circuit 103 via vertical signal line PIXOUT. CDS processing is signal processing for removing reset noise generated in pixel cell 101 or fixed pattern noise unique to a pixel due to a variation in threshold value of a transistor. Column processing circuit 105 temporarily holds pixel signals after signal processing.

The ADC has an auto gain control (AGC) function and an analog-to-digital conversion function, and converts into digital signals pixel signals that are analog signals held in the CDS circuit.

1.1 Circuit Example of Pixel Cell 101

Figure 2:
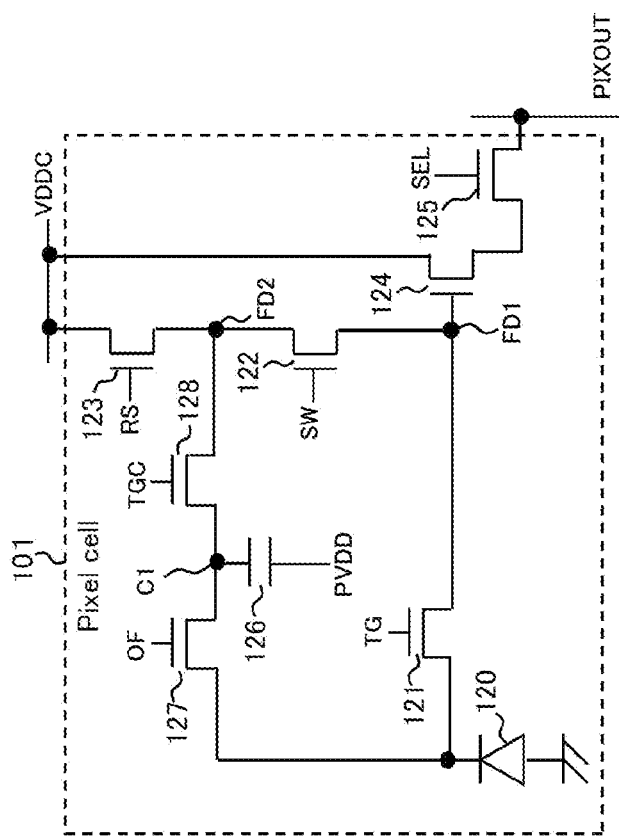
FIG. 2 is a diagram illustrating a configuration example of a pixel cell included in the solid-state imaging device according to Embodiment 1.

FIG. 2 is a diagram illustrating a configuration example of a pixel cell included in solid-state imaging device 100 according to Embodiment 1.

As shown in FIG. 2, pixel cell 101 includes: photoelectric conversion element 120 that accumulates signal charges generated by photoelectric conversion; first transfer transistor 121 that transfers signal charges from photoelectric conversion element 120 to first diffusion layer FD1; capacitive element 126 as a holder that holds signal charges overflowing from photoelectric conversion element 120; and second transfer transistor 128 that transfers the signal charges held in capacitive element 126 to second diffusion layer FD2.

More specifically, pixel cell 101 includes photoelectric conversion element 120, first transfer transistor 121, switch transistor 122, reset transistor 123, amplifier transistor 124, and selection transistor 125. Moreover, pixel cell 101 includes, as a holder, capacitive element 126, overflow transistor 127, and second transfer transistor 128, for example.

For example, an N-channel MOS transistor may be used as each of transistors 121 to 125, 127, and 128. It should be noted that an N-channel MOS transistor (an Nch transistor) is turned ON when a gate potential is at a "High" level, and is turned OFF when a gate potential is at a "Low" level. Moreover, a P-channel MOS transistor (a Pch transistor) is turned ON when a gate potential is at the "Low" level, and is turned OFF when a gate potential is at the "High" level.

First transfer transistor 121 is connected between a cathode electrode of photoelectric conversion element 120 and first diffusion layer FD1. First transfer transistor 121 includes a gate electrode connected to transfer control line TG. When the "High" level is applied to the gate electrode of first transfer transistor 121 from transfer control line TG using transfer pulse φTG, first transfer transistor 121 is turned ON, signal charges (specifically electrons) resulting from photoelectric conversion by photoelectric conversion element 120 and accumulated in photoelectric conversion element 120 are transferred to first diffusion layer FD1.

Overflow transistor 127 is connected between the cathode electrode of photoelectric conversion element 120 and capacitive element 126. Overflow transistor 127 includes a gate electrode connected to overflow control line OF. When signal charges of photoelectric conversion element 120 are generated in excess of an acceptable saturated amount of photoelectric conversion element 120 by DC bias being applied to the gate electrode of overflow transistor 127 from overflow control line OF, and by controlling a potential of a channel portion of overflow transistor 127, signal charges are transferred to capacitive element 126 via overflow transistor 127. It should be noted that when a potential of overflow transistor 127 varies due to a temperature or a variation between chips, a correction circuit that corrects a variation by changing a DC bias value of overflow control line OF may be included. Moreover, although overflow transistor 127 controls charge transfer from photoelectric conversion element 120 to capacitive element 126, it is possible to achieve a function equivalent to overflow transistor 127 by controlling an impurity profile in semiconductor substrate 150 when overflow transistor 127 is absent.

Second transfer transistor 128 is connected between capacitive element 126 and second diffusion layer FD2 disposed between switch transistor 122 and reset transistor 123. Second transfer transistor 128 includes a gate electrode connected to transfer control line TGC. When the "High" level is applied to the gate electrode of second transfer transistor 128 from transfer control line TGC using transfer pulse φTGC, second transfer transistor 128 is turned ON, and signal charges (specifically electrons) accumulated in capacitive element 126 are transferred to second diffusion layer FD2. In this transfer, the signal charges of capacitive element 126 are distributed to second diffusion layer FD2.

Capacitive element 126 includes an other electrode connected to capacitor control line PVDD. A DC bias value may be supplied to capacitor control line PVDD. For example, assuming that a DC bias value is ½ of power supply voltage VDDC, since voltage when capacitive element 126 is reset is power supply voltage VDDC, voltage applied across capacitive element 126 is ½ of power supply voltage VDDC. Moreover, since a potential decreases by a lot of signal charges being transferred when light having a high illuminance is emitted, a potential of capacitive element 126 increases to near 0 V. Voltage applied across capacitive element 126 at this time is ½ of VDDC. In other words, from the time of reset to the time of signal accumulation, an absolute value of voltage applied across capacitive element 126 is ½ of power supply voltage VDDC at maximum. On the other hand, when DC bias supplied to capacitor control line PVDD is VDDC, from the time of reset to the time of signal accumulation, an absolute value of voltage applied across capacitive element 126 is power supply voltage VDDC at maximum. Accordingly, in order to reduce an absolute value of voltage applied across capacitive element 126 from a standpoint of ensuring reliability, it is effective in supplying ½ of power supply voltage VDDC as DC bias supplied to capacitor control line PVDD.

Moreover, a bias value may be supplied as a pulse to capacitor control line PVDD, the bias value not being limited to a DC bias value.

Switch transistor 122 includes: a gate electrode connected to switch control line SW; a drain electrode connected to second diffusion layer FD2; and a source electrode connected to first diffusion layer FD1.

Reset transistor 123 includes: a gate electrode connected to reset control line RS; a drain electrode connected to power supply voltage VDDC; and a source electrode connected to second diffusion layer FD2. When the "High" level is applied to the gate electrode of reset transistor 123 from reset control line RS using reset pulse φRS before signal charges are transferred from photoelectric conversion element 120 to first diffusion layer FD1, reset transistor 123 is turned ON. Additionally, when the "High" level is applied to a gate electrode of switch transistor 122 from reset control line SW1 using switch pulse φSW, switch transistor 122 is also turned ON, and a potential of first diffusion layer FD1 and a potential of second diffusion layer FD2 are reset to power supply voltage VDDC.

Amplifier transistor 124 includes: a gate electrode connected to first diffusion layer FD1; a drain electrode connected to power supply voltage VDDC; and a source electrode connected to a drain electrode of selection transistor 125.

Selection transistor 125 includes: a gate electrode connected to selection control line SEL; the drain electrode connected to the source electrode of amplifier transistor 124; and a source electrode connected to vertical signal line PIXOUT. When a readout row is selected, the "High" level is applied from selection control line SEL using selection pulse φSEL, selection transistor 125 is turned ON, and the source electrode of amplifier transistor 124 and vertical signal line PIXOUT are connected.

Amplifier transistor 124 outputs a reset level corresponding to a potential of first diffusion layer FD1 that has been reset by switch transistor 122 and reset transistor 123, to vertical signal line PIXOUT via selection transistor 125, which is ON; and further outputs a signal level corresponding to a potential of first diffusion layer FD1 after signal charges are transferred by first transfer transistor 121, to vertical signal line PIXOUT. A pair of a reset level and a signal level is of three types depending on switching of switch transistor 122 and second transfer transistor 128. The three types correspond to, for example, a type for low illuminance, a type for medium illuminance, and a type for high illuminance.

Here, when an original charge amount is denoted by q, and a capacitance value of a floating diffusion portion is denoted by C, conversion efficiency η for converting signal charges into voltage is expressed by $\eta = q/C$. Conversion efficiency η is determined by capacitance value C. For this reason, since first diffusion layer FD1 and second diffusion layer FD2 are connected to a gate portion of amplifier transistor 124 when switch transistor 122 is ON, conversion efficiency η is low as compared to a state in which only first diffusion layer FD1 is connected to the gate portion of amplifier transistor 124 when switch transistor 122 is OFF.

Here, higher conversion efficiency η makes it possible to convert signal charges into voltage more efficiently, and to make a voltage value of an output signal higher. Accordingly, it is possible to improve an S/N ratio of pixel signal S to noise component N generated in column processing circuit 105 connected to vertical signal line PIXOUT, and to obtain a high-quality image.

With regard to readout from capacitive element 126, signal charges are not completely transferred from capacitive element 126 to first diffusion layer FD1 when second transfer transistor 128 is turned ON, but are distributed to second diffusion layer FD2 and first diffusion layer FD1. A signal level of capacitive element 126 corresponding to a potential of first diffusion layer FD1 after second transfer transistor 128 is turned ON is outputted to vertical signal line PIXOUT, and reset transistor 123 subsequently resets first diffusion layer FD1 to power supply voltage VDDC. ktC noise is generated when reset transistor 123 is turned OFF. Since a reset level corresponding to the reset potential of first diffusion layer FD1 is outputted to vertical signal line PIXOUT, and an output signal of signal charges accumulated in capacitive element 126 is read out from a difference between the signal level and the reset level, the output signal includes ktC noise. Here, a wide dynamic range is achieved by using an output signal of photoelectric conversion element 120 to generate an image of a low illuminance region, and by using an output signal of capacitive element 126 to generate an image of a high illuminance region. Accordingly, since some signal charges are accumulated in capacitive element 126 for the output signal of capacitive element 126, the ktC noise generated has a minor influence on image quality.

Pixel cell 101 shown in FIG. 2 achieves a wide dynamic range by using an output signal of photoelectric conversion element 120 to generate an image corresponding to a low illuminance, and by using an output signal of capacitive element 126 corresponding to a high illuminance. Moreover, photoelectric conversion element 120 is suitable for long exposure (e.g., continuous exposure) due to the presence of capacitive element 126. Accordingly, it is possible to easily reduce flicker.

Here, flicker reduction will be described. In recent years, light-emitting diode (LED) light sources and laser diode (LD) light sources have become widespread. These light sources often use dynamic lighting in which LEDs are repeatedly turned ON and OFF at a speed unperceivable by the human eye. In other words, flicker occurs at a speed unperceivable by the human eye. For example, LED light sources are used for, aside from luminaires, traffic lights, headlights and brake lights in vehicles, and the like. With dynamic lighting, a light source appears as static lighting to the human eye, but flicker influences a solid-state imaging device. When a solid-state imaging device captures such a light source or performs capturing in an illumination environment in which such a light source is used, there are a case in which an image in which the light source is turned ON is obtained (or a bright image is obtained) and a case in which an image in which the light source is turned OFF is obtained (or a dark image is obtained). To put it another way, flicker occurs in the captured image itself. The latter case, that is, the case in which the image in which the light source is turned OFF is obtained (or the dark image is obtained) can be referred to as an imaging defect. Controlling such an imaging defect due to flicker is referred to as flicker reduction.

It should be noted that although selection transistor 125 is described above, a configuration without selection transistor 125 may be used. In a row selection method for pixel cell 101, it is possible to enable amplifier transistor 124 in a selected row by making a potential of first diffusion layer FD1 of pixel cell 101 in the selected row high and a potential of first diffusion layer FD1 in a non-selected row low, and to output a level corresponding to the potential of first diffusion layer FD1 of pixel cell 101 in the selected row to vertical signal line PIXOUT.

1.2 Cross-Sectional Configuration Example of Pixel Cell 101

The following describes cross-sectional diagrams each schematically illustrating a corresponding one of a first configuration example to a third configuration example of pixel cell 101 in solid-state imaging device 100 according to Embodiment 1.

Figure 3A:
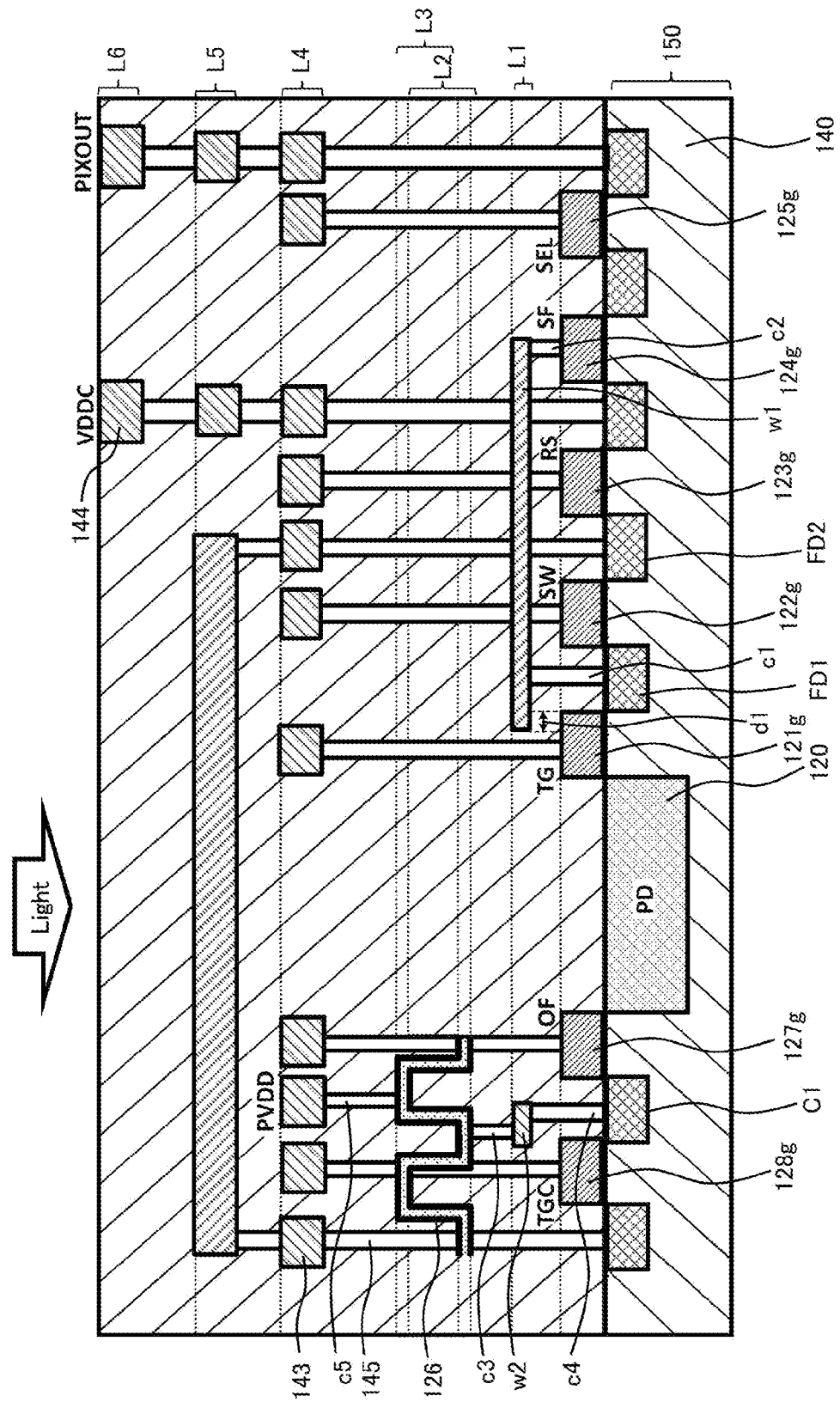
FIG. 3A is a schematic cross-sectional diagram illustrating a first configuration example of a pixel cell included in the solid-state imaging device according to Embodiment 1.

FIG. 3A is a schematic cross-sectional diagram illustrating the first configuration example of pixel cell 101 included in solid-state imaging device 100 according to Embodiment 1. Specifically, FIG. 3A is a schematic cross-sectional view of pixel cell 101 of a frontside illumination type. Pixel cell 101 includes the following in semiconductor substrate 150: well region 140 including p-type impurities; photoelectric conversion element 120 including n-type impurities different from the p-type impurities; a diffusion layer including the n-type impurities; overflow transistor gate 127g; first transfer transistor gate 121g; second transfer transistor gate 128g; switch transistor gate 122g; reset transistor gate 123g; amplifier transistor gate 124g; and selection transistor gate 125g. It should be noted that pixel cell 101 shown in the figure includes wiring layer L1 to wiring layer L6 in each of which a wire can be disposed. Moreover, pixel cell 101 includes: first wire w1 comprising polysilicon; contact c1 comprising polysilicon and connecting first wire w1 and first diffusion layer FD1; and contact c2 comprising polysilicon and connecting first wire w1 and amplifier transistor gate 124g. Wiring layer L4 and wiring layer L5 each include, for example, a wire comprising a copper material. For example, contact 145 comprises a copper material. Semiconductor substrate 150 may be merely a base substrate, a combination of the base substrate and an epitaxial substrate including an epitaxial layer obtained by crystal growth on the base substrate, or merely the epitaxial substrate. For example, the combination of the base substrate and the epitaxial substrate may be a combination of an Si substrate and an Si epitaxial substrate, a combination of an InP substrate and an InGaAs epitaxial substrate, or the like. Photoelectric conversion element 120 is disposed as an embedded diode.

It should be noted that although examples of a material of first wire w1 include a polysilicon material, the present embodiment is not limited to this, and first wire w1 may be formed using a copper material. Additionally, although examples of a material of contacts c1 and c2 include a polysilicon material, the present embodiment is not limited to this, and contacts c1 and c2 may be formed using a copper material.

Capacitive element 126 has an uneven pattern. In other words, opposite electrodes of capacitive element 126 include: an electrode formed as a planar wiring pattern having unevenness in wiring layer L2; and an electrode formed as a planar wiring pattern having unevenness in wiring layer L3. This is an example of a configuration that makes it possible to increase a capacitance value by increasing the opposite surface areas of the electrodes. It should be noted that the unevenness of capacitive element 126 may be provided not only in a direction parallel to the cross section shown in FIG. 3A but also in a direction vertical to the cross section.

First wire w1 is used as a wire connecting first diffusion layer FD1 and amplifier transistor gate 125g. First wire w1 is disposed closer to semiconductor substrate 150 than to capacitive element 126 in wiring layer L1. It is possible to reduce a contact length as compared to a case in which first wire w1 is disposed in any one of wiring layers L2 to L6. To put it another way, it is possible to reduce parasitic capacitance between wires by reducing contact lengths of contacts c1 and c2, and to increase conversion efficiency η. Accordingly, it is possible to achieve high picture quality by increasing S/N.

Moreover, second wire w2 in wiring layer L1 is used as a wire connecting capacitive element 126 and capacitive element node C1. Since this increases an arrangement flexibility of contact c4, an arrangement flexibility of capacitive element 126 increases. As a result, it is possible to achieve a layout capable of maximizing the area of capacitive element 126, to increase the capacitance value of capacitive element 126, and to increase a dynamic range.

Using a polysilicon material as first wire w1 connecting first diffusion layer FD1 and amplifier transistor gate 125g makes it possible to reduce metallic pollution of first diffusion layer FD1 and to decrease leak current.

Moreover, using a polysilicon material as second wire w2 connecting capacitive element 126 and capacitive element node C1 makes it possible to reduce metallic pollution of capacitive element node C1. In consequence, it is possible to decrease leak current generated in capacitive element node C1.

A portion of first wire w1 covers first transfer transistor gate 121g. When the "High" level is applied using transfer pulse φTG, first transfer transistor 121 is turned ON, and signal charges (specifically electrons) resulting from photoelectric conversion by photoelectric conversion element 120 and accumulated in photoelectric conversion element 120 are transferred to first diffusion layer FD1, a potential of first diffusion layer FD1 increases due to parasitic capacitance coupling. This increases the efficiency of transferring the signal charges (specifically electrons) from photoelectric conversion element 120 to first diffusion layer FD1, which makes it possible to suppress the occurrence of an afterimage.

Figure 3B:
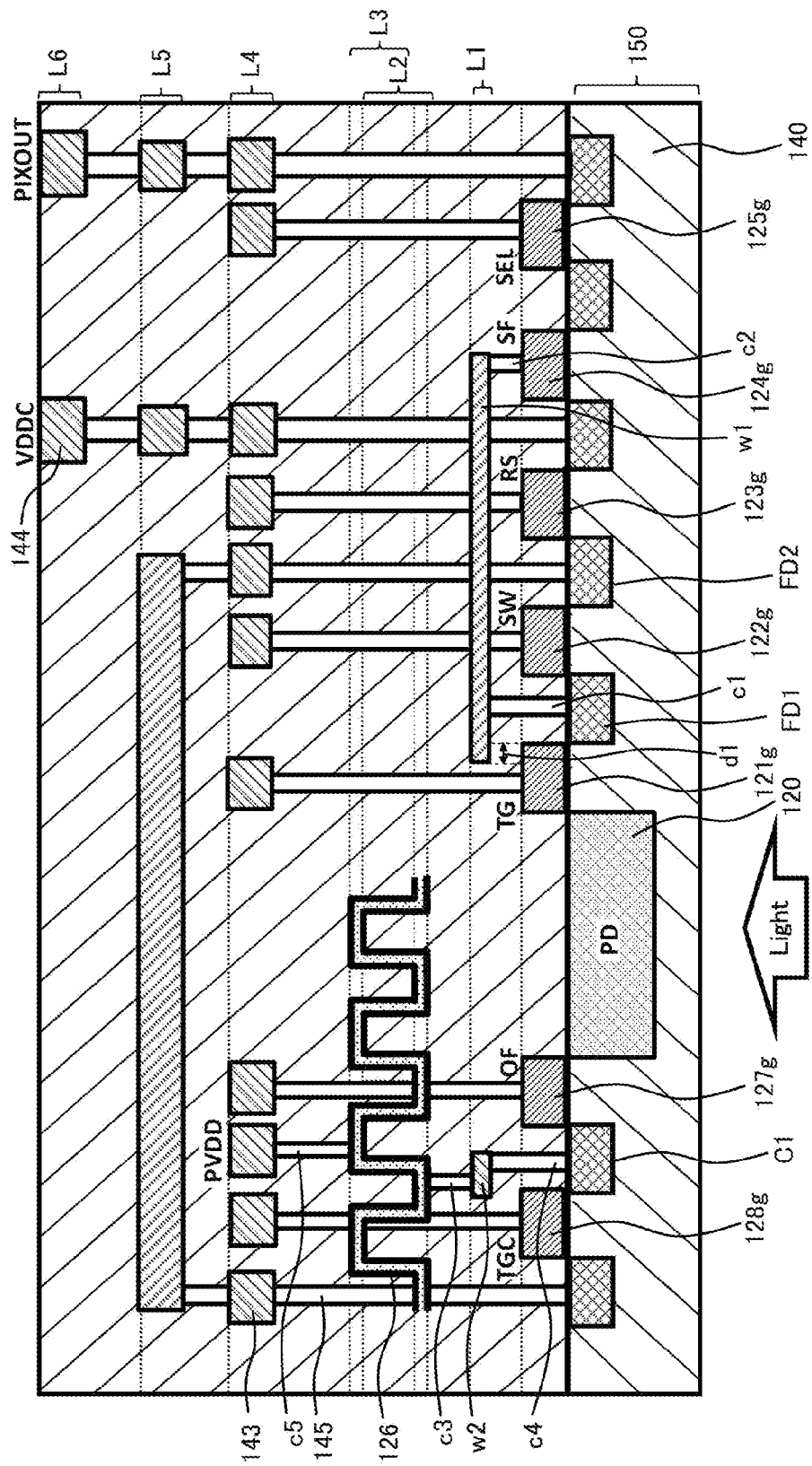
FIG. 3B is a schematic cross-sectional diagram illustrating a second configuration example of a pixel cell included in the solid-state imaging device according to Embodiment 1.

FIG. 3B is a schematic cross-sectional diagram illustrating the second configuration example of pixel cell 101 included in solid-state imaging device 100 according to Embodiment 1. Specifically, FIG. 3B is a schematic cross-sectional view of pixel cell 101 of a backside illumination type. FIG. 3B differs from FIG. 3A in that light enters from below semiconductor substrate 150 and that capacitive element 126 is disposed to cover a portion of photoelectric conversion element 120. Hereinafter, with regard to FIG. 3B, the differences from FIG. 3A will be mainly described.

Capacitive element 126 includes a portion overlapping photoelectric conversion element 120 in a plan view of semiconductor substrate 150. In other words, at least a portion of capacitive element 126 overlaps at least a portion of photoelectric conversion element 120. As a result, since capacitive element 126 can be disposed to cover photoelectric conversion element 120 in pixel cell 101 of the backside illumination type, it is possible to obtain a larger capacitance value in pixel cell 101 than in a pixel cell of a frontside illumination type. This makes it possible to increase a dynamic range.

Figure 3C:
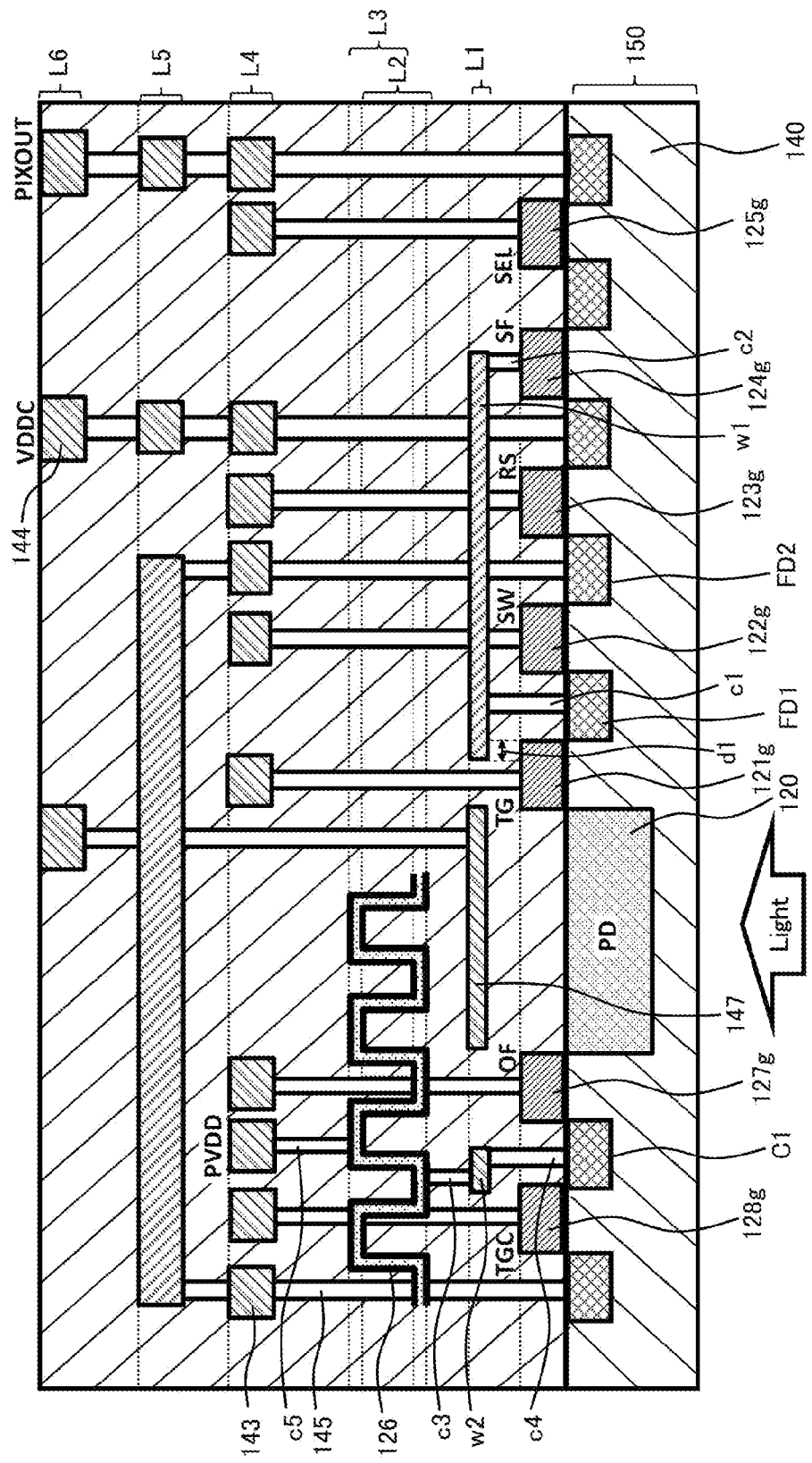
FIG. 3C is a schematic cross-sectional diagram illustrating a third configuration example of a pixel cell included in the solid-state imaging device according to Embodiment 1.

FIG. 3C is a schematic cross-sectional diagram illustrating the third configuration example of pixel cell 101 included in solid-state imaging device 100 according to Embodiment 1. Specifically, FIG. 3C is a schematic cross-sectional view of pixel cell 101 of a backside illumination type. FIG. 3C differs from FIG. 3B in that a wire belonging to wiring layer L1 is formed using a copper material and that wire 147 is disposed as a reflector above photoelectric conversion element 120 in the same wiring layer L1 as first wire w1. Hereinafter, with regard to FIG. 3C, the differences from FIG. 3B will be mainly described.

Wire 147 as the reflector is disposed in the same wiring layer L1 as first wire w1, in a position overlapping at least a portion of photoelectric conversion element 120 in a plan view of semiconductor substrate 150. In the example shown in the figure, wire 147 as the reflector overlaps the entirety of photoelectric conversion element 120. Moreover, wire 147 as the reflector is formed using a copper material having a reflectance higher than a reflectance of polysilicon. For this reason, it is possible to increase the photoelectric conversion efficiency of photoelectric conversion element 120 by causing, when light emitted from below semiconductor substrate 150 passes through photoelectric conversion element 120, wire 147 as the reflector to reflect the light to a photoelectric conversion element 120 side. In this manner, it is possible to suppress a decrease in photoelectric conversion efficiency due to a shape and a material of capacitive element 126.

1.3 Potential of Each Part of Pixel Cell 101

Figure 4:
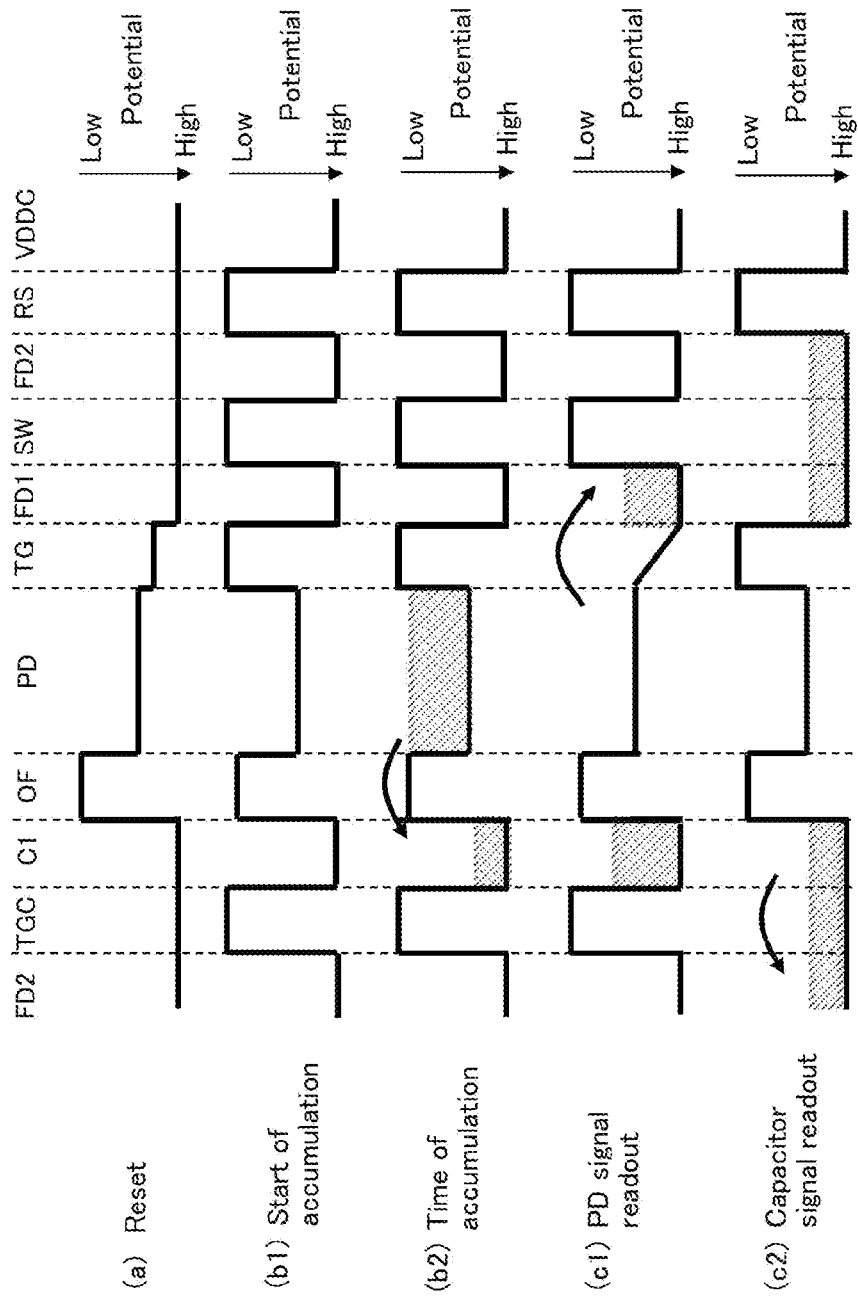
FIG. 4 is a diagram illustrating a potential, in a semiconductor substrate, of a pixel cell included in the solid-state imaging device according to Embodiment 1.

FIG. 4 is a diagram illustrating a potential, in semiconductor substrate 150, of a pixel cell included in solid-state imaging device 100 according to Embodiment 1. The lateral direction in the figure indicates relative positions in semiconductor substrate 150. The vertical direction in the figure indicates that a potential is higher to a downward direction.

"FD2" in the figure indicates a potential of second diffusion layer FD2. "TGC" indicates a potential of semiconductor substrate 150 below second transfer transistor gate 128g. "C1" indicates a potential of capacitive element node C1. "OF" indicates a potential of semiconductor substrate 150 below overflow transistor gate 127g. "PD" indicates a potential of photoelectric conversion element 120. "TG" indicates a potential of semiconductor substrate 150 below first transfer transistor gate 121g. "FD1" indicates a potential of first diffusion layer FD1. "SW" indicates a potential of semiconductor substrate 150 below switch transistor gate 122g. "FD2" indicates a potential of second diffusion layer FD2. "RS" indicates a potential of semiconductor substrate 150 below reset transistor gate 123g. "VDDC" indicates a potential at power supply voltage VDDC.

First, (a) in FIG. 4 shows the time of reset operation, and a "High" level is applied to reset transistor gate 123g from reset control line RS using reset pulse φRS. The "High" level is applied to switch transistor gate 122g from switch control line SW using switch pulse φSW. The "High" level is applied to first transfer transistor gate 121g from transfer control line TG using reset pulse φTG. The "High" level is applied to second transfer transistor gate 128g from transfer control line TGC using reset pulse φTGC. As a result, first diffusion layer FD1, second diffusion layer FD2, and capacitive element node C1 are reset to power supply voltage VDDC. Signal charges are completely transferred from photoelectric conversion element 120 and reset.

(b1) in FIG. 4 shows potentials at the start of exposure within an accumulation control period. A "Low" level is applied to reset transistor gate 123g from reset control line RS using reset pulse φRS. The "Low" level is applied to switch transistor gate 122g from switch control line SW using switch pulse φSW. The "Low" level is applied to first transfer transistor gate 121g from transfer control line TG using reset pulse φTG. The "Low" level is applied to second transfer transistor gate 128g from transfer control line TGC using reset pulse φTGC. For this reason, photoelectric conversion element 120 and capacitive element 126 become capable of accumulating signal charges.

(b2) in FIG. 4 shows potentials at the time of accumulating signal charges within the accumulation control period. Photoelectric conversion element 120 performs photoelectric conversion according to light emitted to photoelectric conversion element 120, and accumulates signal charges. A potential barrier in semiconductor substrate 150 below overflow transistor gate 127g adjacent to photoelectric conversion element 120 is controlled by a DC bias supplied from overflow control line OF so that the potential barrier is lower than a potential barrier in semiconductor substrate 150 below first transfer transistor gate 121g also adjacent to photoelectric conversion element 120. Accordingly, when signal charges of photoelectric conversion element 120 are generated in excess of an acceptable saturated amount of photoelectric conversion element 120, signal charges are transferred to capacitive element 126 via inside semiconductor substrate 150 below overflow transistor gate 127g, and signal charges are accumulated in capacitive element 126.

(c1) in FIG. 4 shows potentials at the time of transferring signal charges accumulated in photoelectric conversion element 120 to first diffusion layer FD1, within the accumulation control period. The "High" level is applied to first transfer transistor gate 121g from transfer control line TG using reset pulse φTG. In consequence, the signal charges accumulated in photoelectric conversion element 120 are completely transferred from photoelectric conversion element 120 to first diffusion layer FD1.

(c2) in FIG. 4 shows potentials at the time of transferring signal charges of capacitive element 126 to first diffusion layer FD1 and second diffusion layer FD2. The "High" level is applied to second transfer transistor gate 128g from transfer control line TGC using reset pulse φTGC. As a result, signal charges accumulated in capacitive element 126 are transferred from capacitive element 126 to second diffusion layer FD2. The "High" level is applied to switch transistor gate 122g from switch control line SW using switch pulse φSW. Consequently, second diffusion layer FD2 and first diffusion layer FD1 are connected, and signal charges accumulated in capacitive element node C1 are transferred to first diffusion layer FD1 and second diffusion layer FD2.

2. Operation Example of Solid-State Imaging Device 100

Figure 5:
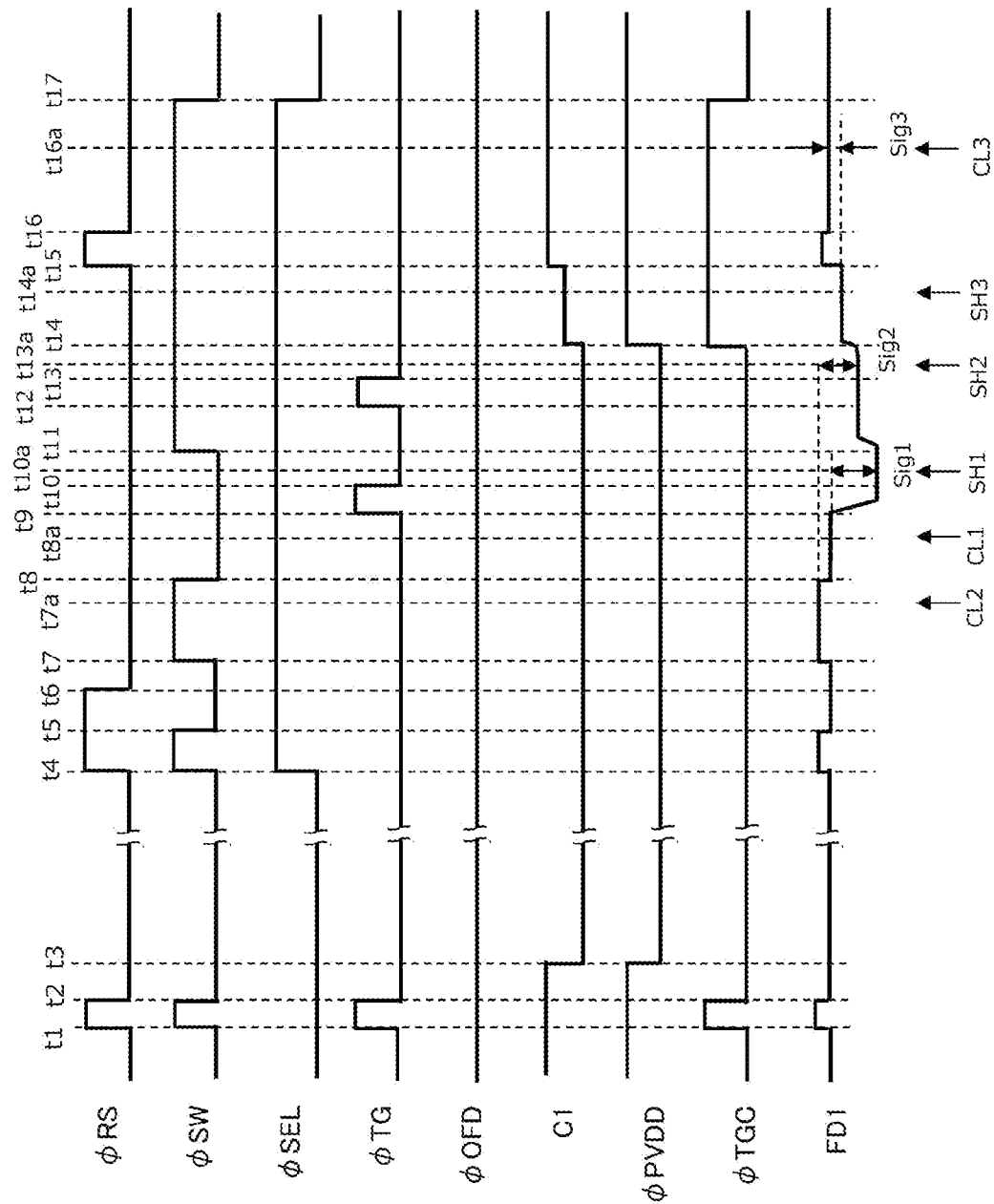
FIG. 5 is a timing chart for describing an operation of a pixel cell included in the solid-state imaging device according to Embodiment 1.

FIG. 5 shows an example of a timing chart for describing an operation of pixel cell 101 shown in FIG. 2.

First, at time t1, φRS and φSW reach a "High" level, and power supply voltage VDDC is applied to second diffusion layer FD2 and first diffusion layer FD1. Moreover, φTG reaches the "High" level, and signal charges of photoelectric conversion element 120 are discharged. Furthermore, φTGC reaches the "High" level, and power supply voltage VDDC is applied to capacitive element 126.

At time t2, φRS and φSW reach a "Low" level. At this time, noise due to switching of reset transistor 123 and switch transistor 122 causes a variation in potential of first diffusion layer FD1 at normal times. Moreover, φTG and φTGC reach the "Low" level, and photoelectric conversion element 120 and capacitive element 126 become capable of accumulating signal charges.

At time t3, φPVDD reaches the "Low" level, which causes a potential of capacitive element node C1 to decrease. Here, capacitive element node C1 is connected to an n-type impurity diffusion layer surrounded by well region 140 including p-type impurities in semiconductor substrate 150 as shown in FIG. 3A. Well region 140 including the p-type impurities is supplied with a GND potential as an example, and is capable of reducing leak current by decreasing a potential difference between the n-type impurity diffusion layer and well region 140 including the p-type impurities by decreasing the potential of capacitive element node C1.

At time t4, φRS and φSW reach the "High" level, and power supply voltage VDDC is applied to second diffusion layer FD2 and first diffusion layer FD1. Moreover, φSEL reaches the "High" level, selection transistor 125 is turned ON, the source electrode of amplifier transistor 124 is electrically connected to vertical signal line PIXOUT. Amplifier transistor 124 forms a source follower by constant current passing through amplifier transistor 124. The "Low" level is applied as φSEL to the gate electrode of selection transistor 125 of another pixel cell connected to the same vertical signal line PIXOUT, and selection transistor 125 is OFF.

At time t5, φSW reaches the "Low" level. At this time, the potential of first diffusion layer FD1 decreases due to parasitic capacitance coupling caused by switching of switch transistor 122.

At time t6, φRS reaches the "Low" level. At this time, noise due to switching of reset transistor 123 causes a variation in potential of second diffusion layer FD2.

At time t7, φSW reaches the "High" level. At this time, the potentials of first diffusion layer FD1 and second diffusion layer FD2 increase due to coupling of parasitic capacitance and gate capacitance of switch transistor 122 caused by switching of switch transistor 122.

This increases the efficiency of transferring signal charges (specifically electrons) from photoelectric conversion element 120 to first diffusion layer FD1, which makes it possible to suppress the occurrence of an afterimage. In addition, a signal level (CL2) is sampled at time t7a when the potential becomes stable.

The series of operations from time t4 to time t7 is an operation relating to a reset operation on first diffusion layer FD1 and a reset operation on second diffusion layer FD2. When the reset operations are performed in a driving operation as described above, it is possible to make the potentials of first diffusion layer FD1 and second diffusion layer FD2 higher at time t7a when φSW is at the "High" level. The reason is that the reset operation on second diffusion layer FD2 is performed at time t6 in a state in which φSW is at the "Low" level. Accordingly, at time t7, first diffusion layer FD1 and second diffusion layer FD2 are in a floating state when φSW reaches the "High" level because φRS is at the "Low" level; and when φSW reaches the "High" level, the potentials are increased by coupling of parasitic capacitance between switch transistor 122 and first diffusion layer FD1 and parasitic capacitance between switch transistor 122 and second diffusion layer FD2. By making the potentials of first diffusion layer FD1 and second diffusion layer FD2 higher, it is possible to facilitate the transfer of signal charges from photoelectric conversion element 120 and to reduce the residue of signal charges.

At time t8, φSW reaches the "Low" level. At this time, a signal level (CL1) is sampled at time t8a when the potential of first diffusion layer FD1 becomes stable.

At time t9, φTG reaches the "High" level. At this time, signal charges are transferred from photoelectric conversion element 120 to first diffusion layer FD1, and the potential of first diffusion layer FD1 decreases.

At time t10, φTG reaches the "Low" level, and the transfer of signal charges from photoelectric conversion element 120 to first diffusion layer FD1 ends.

At time t10a, the potential of first diffusion layer FD1 becomes stable, and a signal level (SH1) is sampled. Then, column processing circuit 105 extracts output signal Sig1 of photoelectric conversion element 120 from a difference between the signal level (CL1) at time 8a and the signal level (SH1) at time 10a.

At time t11, φSW reaches the "High" level. At this time, since capacitance increases only by as much as parasitic capacitance of switch transistor 122 and second diffusion layer FD2 in addition to parasitic capacitance of first diffusion layer FD1, conversion efficiency n decreases, and the potential of first diffusion layer FD1 increases, compared to time t10.

At time t12, φTG reaches the "High" level. At this time, when residual signal charges are in photoelectric conversion element 120, the signal charges are transferred to first diffusion layer FD1 and second diffusion layer FD2, and the potential of first diffusion layer FD1 decreases.

At time t13, φTG reaches the "Low" level, and the transfer of signal charges from photoelectric conversion element 120 to first diffusion layer FD1 and second diffusion layer FD2 ends.

A signal level (SH2) is sampled at time t13a when the potential of first diffusion layer FD1 becomes stable. Then, column processing circuit 105 extracts output signal Sig2 of photoelectric conversion element 120 from a difference between the signal level (CL2) at time 7a and the signal level (SH2) at time 13a.

At time t14, φPVDD reaches the "High" level, and the potential of capacitive element node C1 increases. Moreover, φTGC reaches the "High" level. At this time, since capacitance of second transfer transistor 128 and capacitance of capacitive element 126 increase in addition to capacitance of first diffusion layer FD1, switch transistor 122, and second diffusion layer FD2, conversion efficiency n decreases, compared to time t10. A signal level (SH3) is sampled at time t14a when the potential of first diffusion layer FD1 becomes stable.

At time t15, φRS reaches the "High" level, and power supply voltage VDDC is applied to first diffusion layer FD1, second diffusion layer FD2, and capacitive element node C1.

At time t16, φRS reaches the "Low" level. At this time, noise due to switching of reset transistor 123 causes a variation in potential of first diffusion layer FD1, second diffusion layer FD2, and capacitive element node C1. A signal level (CL3) is sampled at time t16a when the potential of first diffusion layer FD1 becomes stable.

Then, column processing circuit 105 extracts output signal Sig3 of photoelectric conversion element 120 from a difference between the signal level (SH3) at time 14a and the signal level (CL3) at time 16a.

At time t17, φSW and φTGC reach the "Low" level. Moreover, φSEL reaches the "Low" level, selection transistor 125 is turned OFF, and the connection between the source electrode of amplifier transistor 124 and vertical signal line PIXOUT is electrically cut off.

According to the above-described timing chart, it is possible to obtain output signals Sig1 to Sig3 in the three different states in total. Output signal Sig1 is a signal obtained by converting signal charges of photoelectric conversion element 120 into voltage at a higher conversion efficiency when switch transistor 122 is OFF. Output signal Sig2 is a signal obtained by converting signal charges of photoelectric conversion element 120 into voltage when switch transistor 122 is ON. Output signal Sig3 is a signal obtained by converting, into voltage, signal charges of photoelectric conversion element 120 when switch transistor 122 is ON and second transfer transistor 128 is ON, and signal charges accumulated in capacitive element 126 that accumulates signal charges overflowing from photoelectric conversion element 120.

2.1 Subject Illuminance and Signal Output

Figure 6:
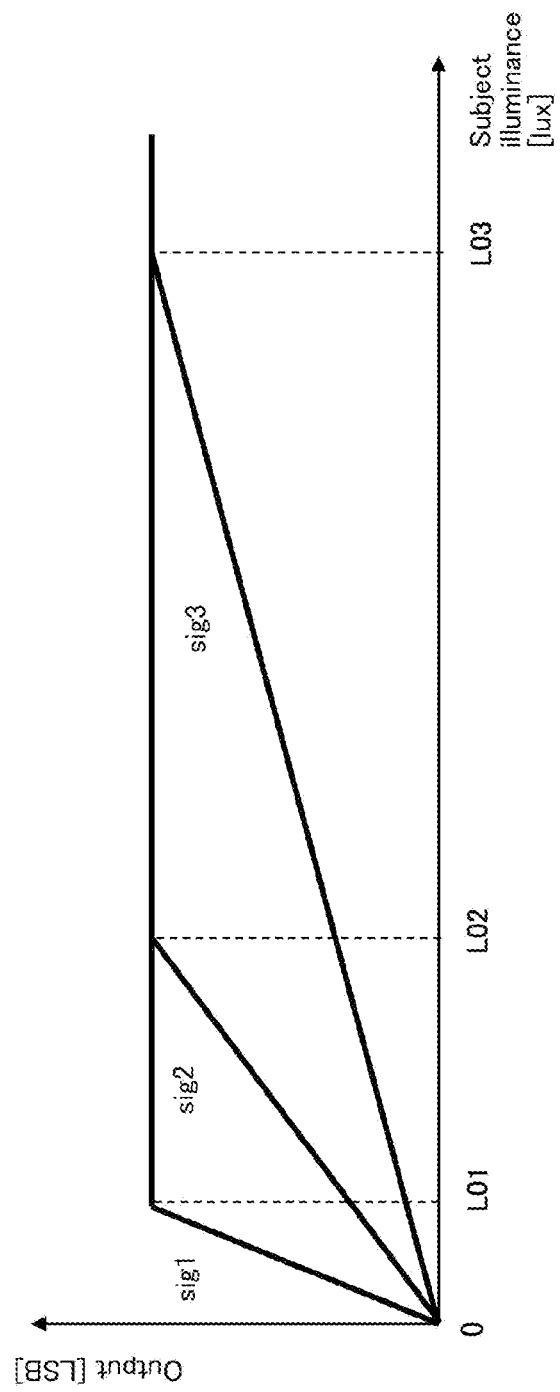
FIG. 6 is a graph showing a relation between a subject illuminance of a pixel cell included in the solid-state imaging device according to Embodiment 1 and a signal output of the pixel cell.

FIG. 6 is a graph showing a relation between a subject illuminance of a pixel cell included in solid-state imaging device 100 according to Embodiment 1 and a signal output of the pixel cell. The horizontal axis indicates a subject illuminance, and the vertical axis indicates an output. The figure shows output signal Sig 1 obtained by converting signal charges of photoelectric conversion element 120 into voltage with a higher conversion efficiency when switch transistor 122 is OFF, and by performing arithmetic processing on the voltage; output signal Sig2 obtained by converting signal charges of photoelectric conversion element 120 into voltage when switch transistor 122 is ON, and by performing arithmetic processing on the voltage; and output signal Sig3 obtained by converting, into voltage, signal charges of photoelectric conversion element 120 and signal charges accumulated in capacitive element 126 that accumulates signal charges overflowing from photoelectric conversion element 120, and by performing arithmetic processing on the voltage. A slope in the graph depends on conversion efficiency, gain setting at the time of AD conversion, an accumulation period, and an exposure period. With regard to output signal Sig1 that covers a subject having a low illuminance, since a conversion efficiency is high, and a gain at the time of AD conversion is set higher than the other output signals, the slope in the graph is steep. Moreover, the output indicates an output after the AD conversion, the maximum value depends on the number of bits at the time of the AD conversion.

An output value of Sig1 after AD conversion reaches the maximum value at subject illuminance L01 and subsequently becomes constant without depending on the subject illuminance.

An output value of Sig2 after AD conversion reaches the maximum value at subject illuminance L02 and subsequently becomes constant without depending on the subject illuminance. Since a conversion efficiency of first diffusion layer FD1 is lower for output signal Sig2 than for Sig1, and a gain at the time of AD conversion is set lower for output signal Sig2 than for Sig1, an output reaches the maximum value at subject illuminance L02 on a higher illuminance side beyond subject illuminance L01.

An output value of Sig3 after AD conversion reaches the maximum value at subject illuminance L03 and subsequently becomes constant without depending on the subject illuminance.

Sig3 has a wider range of image-capturable subject illuminance from 0 to L3 than Sig2 does, and makes it possible to obtain a signal charge amount according to a subject illuminance even when the subject illuminance is relatively high. This is because capacitive element 126 is capable of accumulating signal charges overflowing from photoelectric conversion element 120.

As stated above, output signals Sig1, Sig2, and Sig3 are for low illuminance, medium illuminance, and high illuminance, respectively.

Here, in order to reduce flicker by an LED light source, solid-state imaging device 100 need perform a continuous exposure operation. With regard to output signals Sig1 and Sig2, since signal charges are the signal charges of photoelectric conversion element 120 and are obtained by the continuous exposure operation, flicker is reduced. Moreover, Sig3 makes it possible to obtain an image for which the flicker of the LED light source is reduced while making it possible to capture a subject having a high illuminance by increasing an accumulated signal charge amount using capacitive element 126.

2.2 Subject Illuminance and SN Ratio

Figure 7:
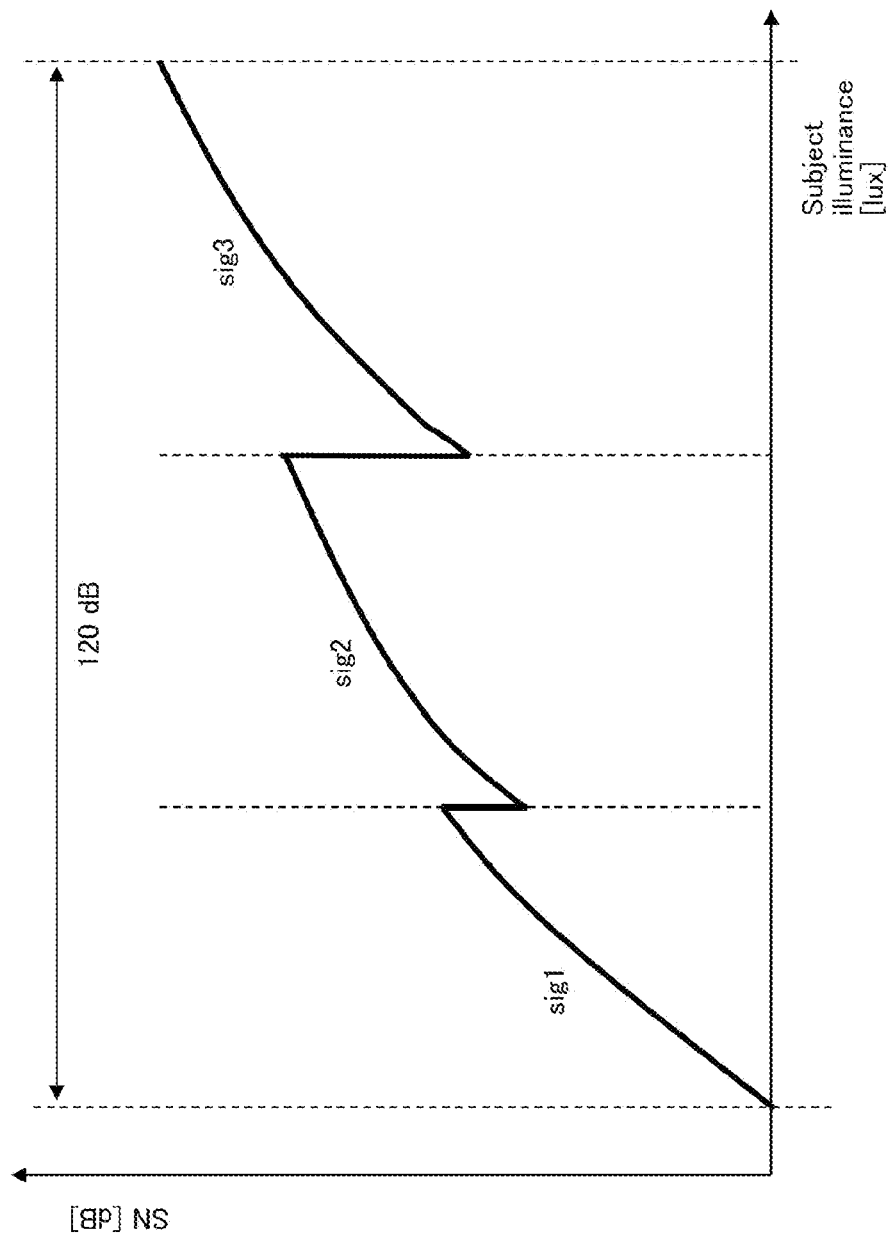
FIG. 7 is a graph showing a relation between a subject illuminance of a pixel cell included in the solid-state imaging device according to Embodiment 1 and an SN (a signal-to-noise ratio) of the pixel cell.

FIG. 7 is a graph showing a relation between a subject illuminance of a pixel cell included in solid-state imaging device 100 according to Embodiment 1 and an SN (a signal-to-noise ratio) of the pixel cell. The horizontal axis indicates a subject illuminance, and the vertical axis indicates an SN. The figure shows an SN of an image relative to a subject illuminance obtained by combining output signals Si1, Sig2, and Sig3 from a low illuminance to a high illuminance. The combination of the output signals makes it possible to ensure a wide dynamic range while maintaining a high SN.

Moreover, when capacitive element 126 is used, kTC noise is included in an output signal, which deteriorates noise. If it is intended to obtain an image having a wide dynamic range using only Sig3, effects of kTC noise become prominent in a low illuminance region, image quality (S/N) is bad, and such image quality cannot be accepted as especially a low illuminance image quality that places emphasis on an SN. According to Embodiment 1, however, since the low illuminance image quality is caused by output signals Sig1 and Sig2 corresponding to signal charges of photoelectric conversion element 120, there is no problem in that the S/N of the low illuminance image quality deteriorates.

For example, it is possible to use an output signal corresponding to signal charges of photoelectric conversion element 120 for generating an image corresponding to a low illuminance, and to maintain a high SN. Moreover, it is possible to achieve a wide dynamic range by using an output signal corresponding to signal charges including signal charges of capacitive element 126 for generating an image corresponding to a high illuminance. Furthermore, photoelectric conversion element 120 is suitable for long exposure (e.g., continuous exposure) due to the presence of capacitive element 126. Accordingly, it is possible to easily reduce flicker.

As stated above, solid-state imaging device 100 according to Embodiment 1 includes: photoelectric conversion element 120 that is disposed on semiconductor substrate 150 and generates signal charges by photoelectric conversion; first diffusion layer FD1 that holds signal charges transferred from photoelectric conversion element 120; capacitive element 126 that holds signal charges overflowing from photoelectric conversion element 120; amplifier transistor 124 that outputs a signal according to the signal charges in first diffusion layer FD1; first contact c1 that is connected to first diffusion layer FD1; second contact c2 that is connected to a gate of amplifier transistor 124; and first wire w1 that connects first contact c1 and second contact c2. First wire w1 is disposed between semiconductor substrate 150 and capacitive element 126 in a normal direction of semiconductor substrate 150. In other words, a shortest distance between semiconductor substrate 150 and first wire w1 is less than a shortest distance between semiconductor substrate 150 and capacitive element 126.

This configuration makes it possible to reduce deterioration of an SN ratio along with an increase in dynamic range. Specifically, it is possible to reduce parasitic capacitance of the first wire, and increase conversion efficiency of amplifier transistor 124 that converts a potential of the first diffusion layer into voltage. As a result, it is possible to reduce the deterioration of the SN ratio and achieve high image quality.

Solid-state imaging device 100 may further include a plurality of wiring layers, and first wire w1 may be included in, among the plurality of wiring layers, wiring layer L1 closest to semiconductor substrate 150.

This configuration makes it possible to further reduce the parasitic capacitance of the first wire.

Wiring layer L1 need not include the gate of amplifying transistor 124.

With this configuration, for example, when a layer including the gate does not include a wire, the wiring layer becomes a wiring layer not including the gate. In such a case, it is possible to effectively reduce the parasitic capacitance of the first wire.

Wiring layer L1 may include the gate of amplifying transistor 124.

With this configuration, for example, when the gate and a wire connected to the gate are in the same wiring layer, the same wiring layer becomes the wiring layer. In such a case, it is possible to effectively reduce the parasitic capacitance of the first wire.

Solid-state imaging device 100 may further include first transfer transistor 121 that transfers signal charges from photoelectric conversion element 120 to first diffusion layer FD1, and first wire w1 may overlap a portion of a gate electrode of first transfer transistor 121 in a plan view of semiconductor substrate 150.

With this configuration, when signal charges are transferred from photoelectric conversion element 120 to first diffusion layer FD1, the potential of first diffusion layer FD1 increases due to parasitic capacitance coupling between the first wire and gate electrode 121g of first transfer transistor 121. This increases the efficiency of transferring the signal charges from photoelectric conversion element 120 to first diffusion layer FD1, which makes it possible to suppress the occurrence of an afterimage.

Solid-state imaging device 100 may further include: third contact c3 that is connected to capacitive element 126; fourth contact c4 that is connected to capacitive element node C1 disposed on semiconductor substrate 150; and second wire w2 that connects third contact c3 and fourth contact c4, and second wire w2 may be included in the same wiring layer L1 as first wire w1.

This configuration increases an arrangement flexibility of capacitive element 126. For example, it is possible to achieve a layout capable of maximizing the area of capacitive element 126, to increase a capacitance value of capacitive element 126, and to increase a dynamic range.

First wire w1 may comprise polysilicon.

This configuration makes it possible to reduce metallic pollution of first diffusion layer FD1 and to decrease leak current.

Solid-state imaging device 100 may have a backside illumination structure.

This configuration increases photoelectric conversion efficiency of photoelectric conversion element 120.

Capacitive element 126 may overlap at least a portion of photoelectric conversion element 120 in a plan view of semiconductor substrate 150.

This configuration allows capacitive element 126 to obtain a larger capacitance value. This makes it possible to easily increase a dynamic range.

Solid-state imaging device 100 may further include wire 147 that is included in the same wiring layer L1 as first wire w1 and serves as a reflector overlapping at least a portion of photoelectric conversion element 120 in a plan view of semiconductor substrate 150.

This configuration increases the photoelectric conversion efficiency of photoelectric conversion element 120. For example, if the reflector is not included, photoelectric conversion efficiency for reflected light may decrease depending on a shape and a material of capacitive element 126. The reflector can prevent this.

Solid-state imaging device 100 may further include: second diffusion layer FD2 that holds signal charges transferred from capacitive element 126; switch transistor 122 that connects first diffusion layer FD1 and second diffusion layer FD2; second transfer transistor 128 that transfers signal charges from capacitive element 126 to second diffusion layer FD2; and reset transistor 123 that resets first diffusion layer FD1.

This configuration makes it possible to control the transfer of signal charges from capacitive element 126 to second diffusion layer FD2.

Solid-state imaging device 100 may turn ON reset transistor 123 and switch transistor 122 to start a reset operation on first diffusion layer FD1 and a reset operation on second diffusion layer FD2.

This configuration makes it possible to reset second diffusion layer FD2 and first diffusion layer FD1 at the same time.

Solid-state imaging device 100 may turn OFF switch transistor 122 after the reset operation on first diffusion layer FD1 and the reset operation on second diffusion layer FD2 are started, to cancel the reset operation on first diffusion layer FD1.

This configuration makes it possible to cancel a reset operation on first diffusion layer FD1 while allowing a reset operation on second diffusion layer FD2 to continue.

Solid-state imaging device 100 may turn OFF reset transistor 123 after the reset operation on first diffusion layer FD1 is canceled, to cancel the reset operation on second diffusion layer FD2.

Solid-state imaging device 100 may output a reset level from amplifier transistor 124 after the reset operation on second diffusion layer FD2 is canceled, in a state in which switch transistor 122 is ON.

This configuration makes it possible to output a reset level in a state in which second diffusion layer FD2 and first diffusion layer FD1 are connected.

Solid-state imaging device 100 may output another reset level from amplifier transistor 124 after the reset level is read out, in a state in which switch transistor 122 is OFF.

This configuration makes it possible to further output a reset level of first diffusion layer FD1 in a state in which second diffusion layer FD2 and first diffusion layer FD1 are not connected.

In solid-state imaging device 100, amplifier transistor 124 may output a first reset level and a second reset level, the second reset level may be outputted from amplifier transistor 124 after the reset operation on second diffusion layer FD2 is canceled, in a state in which switch transistor 122 is ON, and the first reset level may be outputted from amplifier transistor 124 after the second reset level is outputted, in a state in which switch transistor 122 is OFF.

Amplifier transistor 124 may output a first signal level and a second signal level, the first signal level may be outputted from amplifier transistor 124 after the first reset level is outputted, in a state in which first transfer transistor 121 is turned ON and subsequently turned OFF, and switch transistor 122 is OFF, the second signal level may be outputted from amplifier transistor 124 after the first signal level is outputted, in a state in which first transfer transistor 121 is turned ON and subsequently turned OFF, and switch transistor 122 is ON, the first reset level and the first signal level may be subjected to correlated double sampling (CDS), and the second reset level and the second signal level may be subjected to the CDS.

This configuration makes it possible to easily increase a dynamic range. For example, it is possible to obtain a pixel signal for low illuminance at a high sensitivity from the first reset level and the first signal level. Moreover, it is possible to obtain a pixel signal for higher illuminance at a lower sensitivity from the second reset level and the second signal level.

Amplifier transistor 124 may further output a third signal level and a third reset level, the third signal level may be outputted from amplifier transistor 124 after the second signal level is outputted, in a state in which second transfer transistor 128 and switch transistor 122 are ON, and the third reset level may be outputted from amplifier transistor 124 after the third signal level is outputted, in a state in which reset transistor 123 is turned ON and subsequently turned OFF.

This configuration makes it possible to easily increase a dynamic range. For example, it is possible to obtain a pixel signal for low illuminance at a high sensitivity from the first reset level and the first signal level. Moreover, it is possible to obtain a pixel signal for medium illuminance at a medium sensitivity from the second reset level and the second signal level. Furthermore, it is possible to obtain a pixel signal for high illuminance at a low sensitivity from the third reset level and the third signal level. Additionally, it is possible to increase a dynamic range by combining at least two of pixel signals for low illuminance, medium illuminance, and high illuminance.

Embodiment 2

Figure 8:
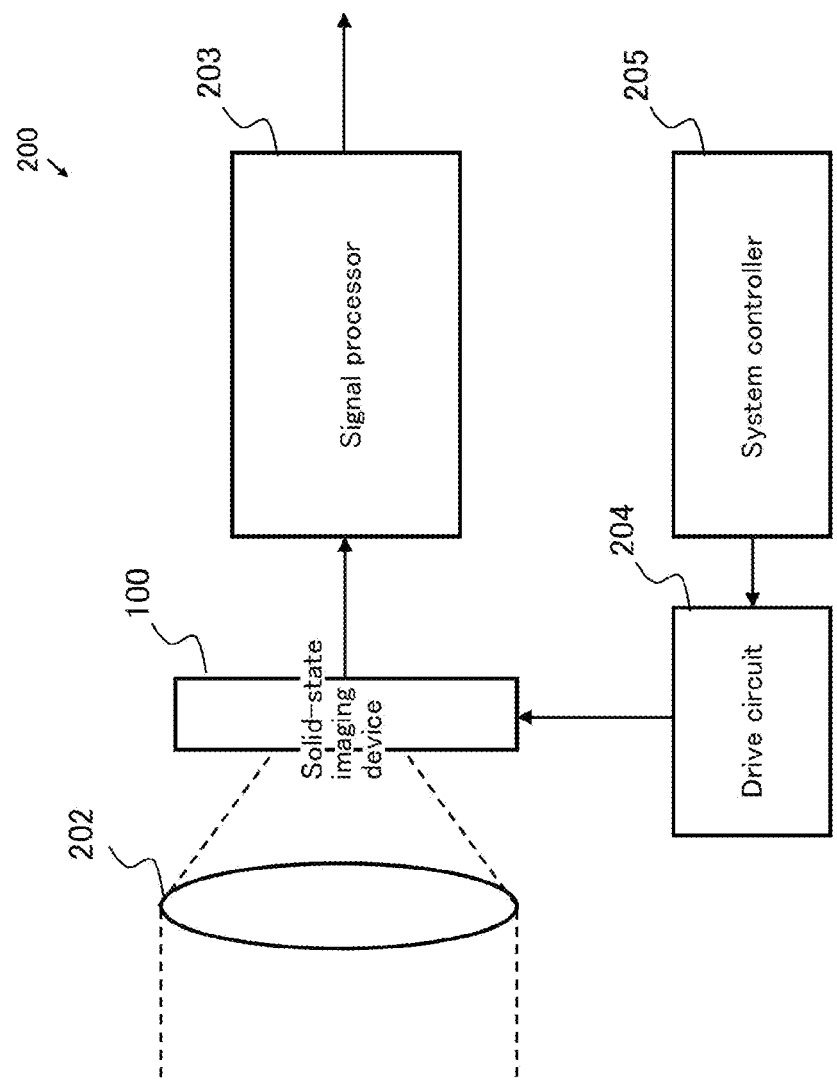
FIG. 8 is a diagram illustrating a configuration example of an imaging apparatus according to Embodiment 2 including a solid-state imaging device.

FIG. 8 is a diagram illustrating a configuration example of imaging apparatus 200 according to Embodiment 2 including solid-state imaging device 100. Imaging apparatus 200 in the figure is a camera system and includes solid-state imaging device 100, imaging optical system 202 including a lens, signal processor 203, drive circuit 204, and system controller 205.

In imaging apparatus 200 shown in FIG. 9, solid-state imaging device 100 according to Embodiment 1 (including each variation) is used.

Drive circuit 204 receives a control signal according to a drive mode from system controller 205, and supplies a drive mode signal to solid-state imaging device 100. In solid-state imaging device 100 supplied with the drive mode signal, timing generation circuit 109 generates a drive pulse corresponding to the drive mode signal and supplies the drive pulse to each block in solid-state imaging device 100.

Signal processor 203 receives an image signal outputted from solid-state imaging device 100 and performs various types of signal processing on the image signal.

As described above, imaging apparatus 200 in the present embodiment includes: solid-state imaging device 100; imaging optical system 202 that guides incident light from a subject to solid-state imaging device 100; and signal processor 203 that processes an output signal from solid-state imaging device 100.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure relates to a solid-state imaging device and an imaging apparatus including a solid-state imaging device as an imaging device, and is suitable for, for example, video cameras, digital cameras, or the like.

The invention claimed is:

1. A solid-state imaging device comprising:
a photoelectric conversion element that is disposed on a semiconductor substrate and generates signal charges by photoelectric conversion;
a first diffusion layer that holds signal charges transferred from the photoelectric conversion element;
a capacitive element that holds signal charges overflowing from the photoelectric conversion element;
an amplifier transistor that outputs a signal according to the signal charges in the first diffusion layer;
a first contact that is connected to the first diffusion layer;
a second contact that is connected to a gate of the amplifier transistor; and
a first wire that connects the first contact and the second contact,
wherein a shortest distance between the semiconductor substrate and the first wire is less than a shortest distance between the semiconductor substrate and the capacitive element.

2. The solid-state imaging device according to claim 1, further comprising:
a plurality of wiring layers,
wherein the first wire is included in, among the plurality of wiring layers, a wiring layer closest to the semiconductor substrate.

3. The solid-state imaging device according to claim 2, wherein the wiring layer does not include the gate of the amplifier transistor.

4. The solid-state imaging device according to claim 2, wherein the wiring layer includes the gate of the amplifier transistor.

5. The solid-state imaging device according to claim 1, further comprising:

a first transfer transistor that transfers signal charges from the photoelectric conversion element to the first diffusion layer,
wherein the first wire overlaps a portion of a gate electrode of the first transfer transistor in a plan view of the semiconductor substrate.

6. The solid-state imaging device according to claim 1, further comprising:
a third contact that is connected to the capacitive element;
a fourth contact that is connected to a capacitive element node disposed on the semiconductor substrate; and
a second wire that connects the third contact and the fourth contact,
wherein the second wire is included in a same wiring layer as the first wire.

7. The solid-state imaging device according to claim 1, wherein the first wire comprises polysilicon.

8. The solid-state imaging device according to claim 1, wherein the solid-state imaging device has a backside illumination structure.

9. The solid-state imaging device according to claim 8, wherein the capacitive element overlaps at least a portion of the photoelectric conversion element in a plan view of the semiconductor substrate.

10. The solid-state imaging device according to claim 8, further comprising:
a wire that is included in a same wiring layer as the first wire and serves as a reflector overlapping at least a portion of the photoelectric conversion element in a plan view of the semiconductor substrate.

11. The solid-state imaging device according to claim 5, further comprising:
a second diffusion layer that holds signal charges transferred from the capacitive element;
a switch transistor that connects the first diffusion layer and the second diffusion layer;
a second transfer transistor that transfers signal charges from the capacitive element to the second diffusion layer; and
a reset transistor that resets the first diffusion layer.

12. The solid-state imaging device according to claim 11, wherein the reset transistor and the switch transistor are turned ON to start a reset operation on the first diffusion layer and a reset operation on the second diffusion layer.

13. The solid-state imaging device according to claim 12, wherein the switch transistor is turned OFF after the reset operation on the first diffusion layer and the reset operation on the second diffusion layer are started, to cancel the reset operation on the first diffusion layer.

14. The solid-state imaging device according to claim 13, wherein the reset transistor is turned OFF after the reset operation on the first diffusion layer is canceled, to cancel the reset operation on the second diffusion layer.

15. The solid-state imaging device according to claim 14, wherein a reset level is outputted from the amplifier transistor after the reset operation on the second diffusion layer is canceled, in a state in which the switch transistor is ON.

16. The solid-state imaging device according to claim 15, wherein another reset level is outputted from the amplifier transistor after the reset level is read out, in a state in which the switch transistor is OFF.

17. The solid-state imaging device according to claim 14, wherein the amplifier transistor outputs a first reset level and a second reset level,
the second reset level is outputted from the amplifier transistor after the reset operation on the second diffusion layer is canceled, in a state in which the switch transistor is ON, and
the first reset level is outputted from the amplifier transistor after the second reset level is outputted, in a state in which the switch transistor is OFF.

18. The solid-state imaging device according to claim 17, wherein the amplifier transistor outputs a first signal level and a second signal level,
the first signal level is outputted from the amplifier transistor after the first reset level is outputted, in a state in which the first transfer transistor is turned ON and subsequently turned OFF, and the switch transistor is OFF,
the second signal level is outputted from the amplifier transistor after the first signal level is outputted, in a state in which the first transfer transistor is turned ON and subsequently turned OFF, and the switch transistor is ON,
the first reset level and the first signal level are subjected to correlated double sampling (CDS), and
the second reset level and the second signal level are subjected to the CDS.

19. The solid-state imaging device according to claim 18, wherein the amplifier transistor further outputs a third signal level and a third reset level,
the third signal level is outputted from the amplifier transistor after the second signal level is outputted, in a state in which the second transfer transistor and the switch transistor are ON, and
the third reset level is outputted from the amplifier transistor after the third signal level is outputted, in a state in which the reset transistor is turned ON and subsequently turned OFF.

20. An imaging apparatus comprising:
the solid-state imaging device according to claim 1 that captures a subject;
an imaging optical system that guides incident light from the subject to the solid-state imaging device; and
a signal processor that processes an output signal from the solid-state imaging device.

* * * * *